(12) United States Patent
Sawada et al.

(10) Patent No.: US 8,678,480 B2
(45) Date of Patent: Mar. 25, 2014

(54) FUNCTIONAL PANEL AND METHOD FOR JOINING SAME

(75) Inventors: Takahiko Sawada, Hitachinaka (JP); Hiroshi Aoyama, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 255 days.

(21) Appl. No.: 13/128,928

(22) PCT Filed: Nov. 19, 2009

(86) PCT No.: PCT/JP2009/006231
§ 371 (c)(1),
(2), (4) Date: May 12, 2011

(87) PCT Pub. No.: WO2010/058582
PCT Pub. Date: May 27, 2010

(65) Prior Publication Data
US 2011/0214903 A1    Sep. 8, 2011

(30) Foreign Application Priority Data
Nov. 21, 2008    (JP) ................................. 2008-297609

(51) Int. Cl.
*B32B 3/20*    (2006.01)
(52) U.S. Cl.
USPC ........... 296/191; 180/65.1; 280/782; 428/188
(58) Field of Classification Search
USPC ...................... 174/34; 180/60, 65.1; 200/239;
249/144; 280/782, 785; 296/191, 208;
428/57, 188
See application file for complete search history.

(56) References Cited

U.S. PATENT DOCUMENTS

| 1,070,211 | A | * | 8/1913 | Vauclain | 105/415 |
| 5,288,538 | A | * | 2/1994 | Spears | 428/116 |
| 5,614,292 | A | * | 3/1997 | Saylor | 428/209 |
| 5,629,828 | A | * | 5/1997 | DeVries | 361/272 |
| 6,383,599 | B1 | * | 5/2002 | Bell et al. | 428/95 |

(Continued)

FOREIGN PATENT DOCUMENTS

| CN | 1382010 | 11/2002 | |
| DE | 3821305 A1 | * 2/1990 | ............... F16P 3/12 |

(Continued)

OTHER PUBLICATIONS

Chinese Official Action dated Jul. 24, 2013, for CN Application No. 200980146543.1.

*Primary Examiner* — Glenn Dayoan
*Assistant Examiner* — Paul Chenevert
(74) *Attorney, Agent, or Firm* — Antonelli, Terry, Stout & Kraus, LLP.

(57) ABSTRACT

There is provided a functional panel that can be joined and disassembled with ease by solving problems with a functional panel including electrical conductors integrally molded therewith, causing occurrence of cracking on the surface thereof, or cracking of a molded unit around the periphery of the electrical conductor, thereby rendering the electrical conductor susceptible to a break when a flexural load, an impact load, and so forth, acts on the functional panel. The functional panel comprises a main body of a panel member, an electrical conductor coated with a semi-cured resin having heat resistance and insulation properties, and a reinforcing fiber having a continuous filament, for fixing the electrical conductor to the main body of the panel member to thereby provide enhancement, and the functional panel is formed by exposing one end, and the other end of the electrical conductor from respective end faces of the panel member formed by integral molding.

11 Claims, 3 Drawing Sheets

(56) References Cited

U.S. PATENT DOCUMENTS

| | | | |
|---|---|---|---|
| 6,431,638 B1 * | 8/2002 | Mrozowski et al. | 296/146.8 |
| 6,537,641 B1 * | 3/2003 | Kroll | 428/95 |
| 6,557,925 B2 * | 5/2003 | Odashima et al. | 296/146.7 |
| 6,631,775 B1 * | 10/2003 | Chaney | 180/68.5 |
| 6,689,446 B2 * | 2/2004 | Barnes et al. | 428/68 |
| 6,740,822 B2 | 5/2004 | Watanabe | |
| 7,152,907 B2 * | 12/2006 | Salhoff et al. | 296/146.7 |
| 7,216,911 B2 * | 5/2007 | Andre et al. | 296/26.08 |
| 2009/0044449 A1 * | 2/2009 | Appel et al. | 49/28 |

FOREIGN PATENT DOCUMENTS

| | | |
|---|---|---|
| JP | 63-021114 | 1/1988 |
| JP | 63-142284 | 9/1988 |
| JP | 63-285808 | 11/1988 |
| JP | 64-13625 | 1/1989 |
| JP | 2002-095139 | 3/2002 |

\* cited by examiner

FUNCTIONAL PANEL AND METHOD FOR JOINING SAME

TECHNICAL FIELD

The invention relates to a functional panel, and a method for joining the same. The functional panel is for use in the floor panel of an electric vehicle, and so forth, wherein electrical conductors such as various types of wiring, or electronic components, for use in communications, control, or power supply, are disposed.

BACKGROUND ARTS

Intense efforts to develop an electric vehicle have lately been made for the reasons of non-emission of an exhaust gas, less noise generation, and so forth. Some of electric vehicles have already been put to practical use. The electric vehicle runs by acquiring all, or part of electric power necessary for running from a battery mounted in the vehicle to thereby drive its motor. Further, in the case of any of a brake system, a vehicle-drive mechanism, a power window, a wiper, and interior parts, use of an electronic control system is in the mainstream, the electronic control system being activated upon acquisition of necessary power from the battery. Such electronic equipment components that require electric power need to be connected with the battery using an electric wire, a signal line, and so forth.

While there have since been further advances in reduction in weight, thickness and size with respect to an electronic component, and the number of parts for the electronic components has increased, as the number of parts for the electronic components increases, so does usage of cables interconnecting the battery and the electronic components. Further, since there is the needs for stringing cables so as to match the shape/structure of the electronic component, there emerges a problem in that the cable or the signal line will become longer than a necessary length, causing an increase in the weight of a wire harness, and an increase in losses due to an increase in electrical resistance. Furthermore, there will occur an increase in manufacturing cost, due to bundling of electric wires, designing and manufacturing of fixed fittings, and so forth, adjustment in attachment of the fittings, and the electric wires, and an increase in the number of process steps, owing to a complex wiring work, and so forth.

As a means for solving these problems, there has been known a means whereby electric wires are embedded in a molded module, or a functional panel, formed by integral molding (refer to for example, Patent Document 1, and Patent Document 2).

RELATED ART DOCUMENTS

Patent Documents

Patent Document 1: Japanese Unexamined Patent Publication No. 2002-95139
Patent Document 2: Japanese Unexamined Patent Publication No. S63 (1998)-285808

SUMMARY OF INVENTION

Problems to be Solved by the Invention

In the case of Patent Document 1, there has been proposed a method for manufacturing the peripheral structure of a molded module, and the molded module whereby a number of components is reduced by integrating electric wires with the roof liner of a vehicle, thereby enabling the electric wires inside a molded unit to be electrically connected to various electric components with ease and swiftness. With the molded module that is integrally molded with these electric wires, there has existed a problem in that while strength as well as rigidity of the electric wire, in the direction of the cross section thereof, is enhanced, cracking occurs to the surface of the molded module, or the molded unit is broken around the periphery of each of the electric wires when an external force, such as a flexural load, an impact load, and so forth, acts on the molded module, on the other hand, thereby rendering the electric wire susceptible to a break.

Further, in the case of Patent Document 2, there has existed a problem in that in order to manufacture an integrally molded product as large-sized products for use in an aircraft, vehicle, and so forth, in which an electric wire assembly is embedded, a huge cost is involved for building large molding facilities, securing a plant site on which the molding facilities are to be installed, and molding operation and an increase in cost, attributable to deterioration in yield, and disposal of defective products.

It is therefore an object of the invention to solve those problems encountered with the technologies according to the Related Art, and to provide a functional panel light in weight, capable of being easily joined together, and disassembled.

Means for Solving the Problems

In accordance with one aspect of the invention, there is provided a functional panel comprising a main body of a panel member, an electrical conductor coated with a semi-cured resin having heat resistance and insulation properties, and a reinforcing fiber having a continuous filament, for fixing the electrical conductor to the main body of the panel member to thereby provide enhancement, wherein the functional panel is formed by exposing one end, and the other end of the electrical conductor from the respective end faces of the panel member formed by integral molding.

Further, the functional panel comprises fiber sheets impregnated with a thermosetting resin, respectively, to be laminated, the electrical conductors embedded in the fiber sheets, as laminated, by molding, and the reinforcing fiber disposed between the fiber sheets in such a way as to reinforce mutual bonding of the fiber sheet with the electrical conductor.

Still further, the functional panel comprises fiber sheets disposed in a plurality of directions, respectively, along the surface of the panel, the electrical conductors embedded in the fiber sheets, by molding, and the reinforcing fiber disposed between the fiber sheets in such a way as to reinforce mutual bonding of the fiber sheet with the electrical conductor, wherein the functional panel is integrally molded by injecting resin therein.

The end faces of the panel member, exposing one end, and the other end of the electrical conductor, respectively, have a recess, and a protrusion, respectively, the recess, and the protrusion being capable of being joined with each other in a joint-like manner, and being disassembled. Further, a plurality the functional panels are joined with each other through the intermediary of the respective end faces thereof, and the ends of the electrical conductor in the respective functional panels are electrically connected with each other, thereby making up a new functional panel. Further, a functional panel having an electrical conductor to be joined with the top surface of the functional panel is provided, and the respective ends of both the electrical conductors are electrically connected with each other. The respective ends of the electrical conductors are provided with a solder layer.

Further, the functional panel is used as a structural unit of an electric vehicle.

In accordance with another aspect of the invention, there is provided a method for joining a functional panel, comprising the steps of preparing a panel member molded by integral molding, the panel member comprising a main body of the panel member, an electrical conductor coated with a semi-cured resin having heat resistance and insulation properties, and a reinforcing fiber having a continuous filament, for fixing the electrical conductor to the main body of the panel member to thereby provide enhancement, forming a plurality of functional panels by exposing one end, and the other end of the electrical conductor from respective end faces of each of the panel members, and joining the plurality of functional panels with each other, wherein the end face of one of the plurality of functional panels, exposing the end of the electrical conductor embedded in the one of the plurality of functional panels is brought into face-contact with the end face of the other functional panel, exposing the other end of the electrical conductor embedded in the other functional panel, thereby causing the electrical conductors to be electrically connected with each other before joining, and disassembling.

The method for joining a functional panel, further comprises the step of joining, and disassembling the functional panel that comprises fiber sheets impregnated with a thermosetting resin, respectively, to be laminated, the electrical conductors embedded in the fiber sheets, as laminated, by molding, and the reinforcing fiber disposed between the fiber sheets in such a way as to reinforce mutual bonding of the fiber sheet with the electrical conductor.

The method for joining a functional panel, further comprises the step of joining, and disassembling the functional panel that comprises fiber sheets disposed in a plurality of directions, respectively, along the surface of the panel, the electrical conductors embedded in the fiber sheets, by molding, and the reinforcing fiber disposed between the fiber sheets in such a way as to reinforce mutual bonding of the fiber sheet with the electrical conductor, the functional panel being integrally molded by injecting resin therein.

A pair of end faces of the panel member, exposing the one end, and the other end of the electrical conductor, respectively, in such a way as to be joined together, have a recess, and a protrusion, respectively, the recess, and the protrusion being capable of being joined with each other in a joint-like manner, and being disassembled. Further, the ends of the electrical conductor, exposed to the respective end faces of the functional panel, have a solder layer, respectively, and the solder layer is melted after joining of the functional panel, thereby effecting electrical connection between the respective ends of the electrical conductor.

Effects of the Invention

The functional panel according to the invention comprises a main body of a panel member, an electrical conductor coated with a semi-cured resin having heat resistance and insulation properties, and a reinforcing fiber having a continuous filament, for fixing the electrical conductor to the main body of the panel member to thereby provide enhancement, and the functional panel is formed by exposing one end, and the other end of the electrical conductor from the respective end faces of the panel member formed by integral molding, so that it is possible to realize a functional panel wherein the electrical conductor is rendered insusceptible to a break against a flexural load, and an impact load, acting thereon.

Further, it is possible to reduce the number of wiring steps at the time of wiring, or assembling, and the count of components associated with wiring. Furthermore, at the timer of a break in wiring, and so forth, it is possible to disassemble a minimum range of a trouble spot with ease before replacement.

DESCRIPTION OF EMBODIMENT

Figure 1:
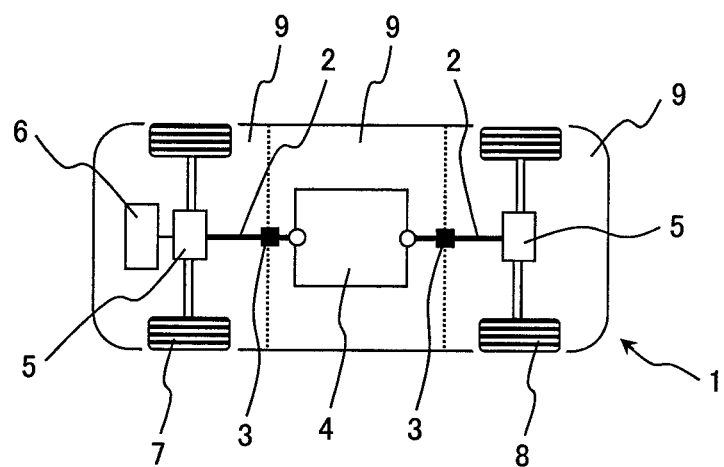
FIG. 1 is a schematic diagram showing an electric vehicle to which the invention is applied.

Examples to which the invention is applied to the body structure of an electric vehicle are specifically described hereinafter with reference to the accompanying drawings First Embodiment FIG. 1 is a schematic diagram showing an electric vehicle to which the invention is applied. A panel member 9 made of a carbon fiber reinforced resin (plastics) is provided so as to extend in the longitudinal direction of an electric vehicle 1, and power supply lines 2 as electrical conductors are embedded in the panel member 9 by integral molding. In the figure, reference numeral 3 denotes a terminal for use in electrical joining of the power supply lines 2, 4 a battery, 5 a drive motor, 6 a control unit, 7 a front wheel, and 8 a rear wheel.

Herein, for a resin material of the parent material of the panel member 9 included in a functional panel according to the invention, use is generally made of thermosetting resin, and thermoplastic resin, however, the thermosetting resin excellent in strength as well as rigidity of a molded unit is preferably used. The thermosetting resin includes, for example, unsaturated polyester, vinyl ester, epoxy, resol-type phenol, urea-melanin, and polyimide, further including a copolymer of resins selected from the group of these resins as above, or a denatured resin thereof, and a resin obtained by blending at least two elements selected from the group with each other. In order to enhance impact resistance, elastomer, or a rubber component may be added thereto. Epoxy resin, in particular, is preferably used from the standpoint of mechanical characteristics of the molded unit.

Further, as a fiber stock of the group of reinforcing fibers for use in the panel member 9 according to the invention, use can be made of any selected from the group consisting of metallic fibers, such as, for example, an aluminum fiber, a brass fiber, a stainless steel fiber, and so forth, a glass fiber, carbon fibers or graphite fibers, based on polyacrylonitrile-base, rayon, lignin and pitch, respectively, a organic fiber, such as aromatic polyamide fiber, a polyaramide fiber, a PBO fiber, a poly (phenylene sulfide) fiber, a polyester fiber, an acrylic fiber, a nylon fiber, a polyethylene fiber, and so forth, a silicone carbide fiber, a silicon nitride fiber, an alumina fiber, a silicon carbide fiber, a boron fiber, and so forth. Those fiber stocks can be used singly or in combination of at least two kinds thereof. Use may be made of these fibers with surface treatment applied thereto. The surface treatment includes cladding treatment on metal, treatment with the use of a coupling agent, treatment with the use of a sizing agent, adhesion treatment with the use of an additive, and so forth. For the fiber stock, the carbon fibers that are small in specific gravity, and high in strength and coefficient of elasticity are most preferably used.

Figure 2:
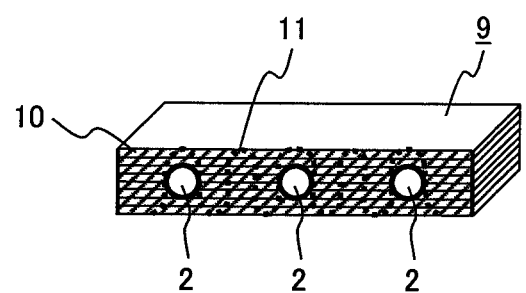
FIG. 2 is a perspective view showing a functional panel according to a first embodiment of the invention.

FIG. 2 is a perspective view showing the panel member 9 in which three power supply lines 2 coated with a semi-cured phenol resin, respectively, are embedded by integral molding in such a way as to be independent from each other.

A method for manufacturing the panel member 9 is described hereunder. To be specific, a plurality of carbon fiber sheets 10 impregnated with an epoxy resin, respectively, are stuck together to be laminated over a mold with a mold-releasing agent applied to the surface thereof. In a stage where lamination of the carbon fiber sheets 10 is partially completed, the power supply line 2 coated with the semi-cured phenol resin is disposed at respective desired positions on laminated carbon fiber sheets 10, on the top of which other carbon fiber sheets 10 are stuck together again to be laminated, thereby completing lamination of the carbon fiber sheets that are not laminated as yet. Thereafter, a carbon fiber 11 serving as a reinforcing fiber having a continuous filament is weaved around the periphery of the power supply line 2 provided inside the panel member 9, in the direction of a board thickness thereof, and subsequently, pressure-molding and heating-molding are applied thereto by use of an integral molding process.

If the power supply lines 2 are embedded in the panel member 9 that is formed by sticking the carbon fiber sheets 10 with each other, the rigidity as well as the strength of the panel member 9, in the direction of the cross section of the power supply line, are enhanced, however, when an external force, such as a flexural load, an impact load, and so forth, acts on the panel member 9, this will pose the risk that cracking occurs inside the panel member 9, and the power supply line 2 peels off from the panel member, thereby causing the carbon fiber sheets 10 to undergo delamination.

In the case of a first embodiment of the invention, the panel member 9 is molded by use of the integral molding process after further weaving the carbon fiber 11 around the periphery of the power supply line 2 provided inside the carbon fiber sheets 10, in the direction of the board thickness of the panel member 9, so that, in the case of a bending stress acting on the panel member 9, it is possible to increase resistance to a stress that causes cracking and breakage, occurring to the panel member 9, on the periphery of the power supply line 2, thereby preventing occurrence of such defects.

In this connection, a configuration in which the carbon fibers 11 as the reinforcing fibers are provided in the panel member 9 is not limited to such a configuration as described above with reference to the present embodiment. Alternatively, molding may be performed by use of an integral molding means whereby power supply lines and a necessary number of reinforcing fibers are prearranged so as to be lined up in respective directions that are effective for reinforcement to be subsequently provided in a mold, and an epoxy resin is injected therein before pressurizing, and heating. For the semi-cured resin material for use in coating of the supply line 2, use is preferably made of an epoxy resin, or resol-type phenol resin from the viewpoint of heat resistance, and resistance to electrical insulation. Further, there is no particular limitation to the supply line 2 as long as it is electrically conductive, and for the power supply line 2, use may be made of a metal conductor made of copper, and so forth, besides an electric wire.

Second Embodiment

Figure 3:
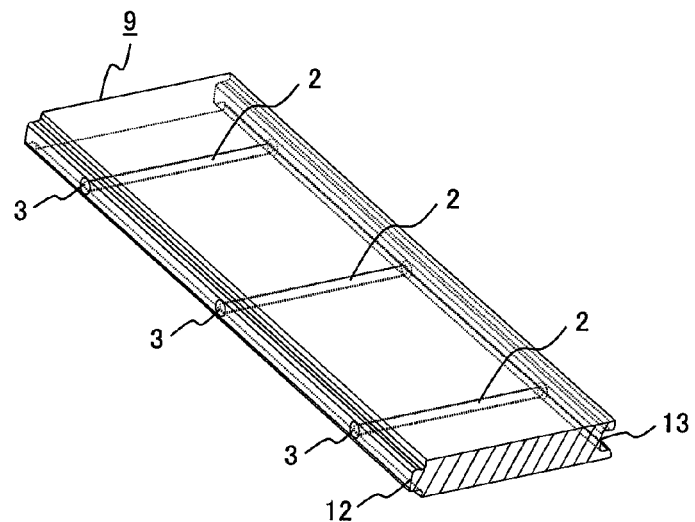
FIG. 3 is a perspective view showing a functional panel according to a second embodiment of the invention.

FIG. 3 shows a second embodiment of a panel member 9 according to the invention. In FIG. 3, there is shown a part of the panel member 9, and three lengths of power supply lines 2 provided so as to be independent from each other are embedded therein.

With the present embodiment, a protrusion 12 is formed on an end face of the panel member 9, in the frontward direction of a vehicle, and a recess 13 is formed on an end face of the panel member 9, in the rearward direction of the vehicle. Owing to such a structure as described, the protrusion 12 of one of the panel members 9 can be fitted into the recess 13 of the other of the panel members 9.

Figure 4:
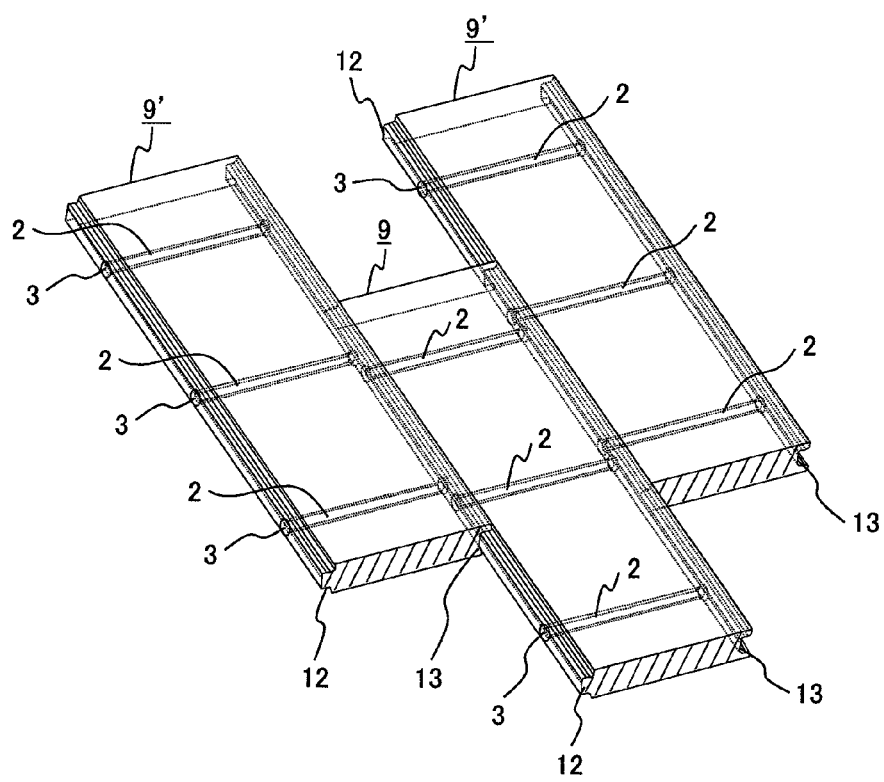
FIG. 4 is a perspective view showing a mechanical linkage structure of the functional panel according to the second embodiment of the invention.

More specifically, with the second embodiment of the invention, the protrusion 12 of the one of the panel members 9 is substantially aligned in contours with the recess 13 of the panel member 9', as one of a pair of the panel members, the panel member 9' being already incorporated in the vehicle and fixed thereto, and the one of the panel members 9 is caused to slide in the longitudinal direction thereof, as shown in FIG. 4, thereby enabling respective panel members 9 to be fitted and incorporated.

With the second embodiment, as a means for joining one panel members 9 with the other panel members 9', there is shown a configuration by way of example, whereby the panel members are joined with each other by means of a coupling structure, thereby realizing integration, however, there are available various means including a configuration for realizing integration by joining the panel members with each other by use of a mechanical linkage means such as a bolt, screw, rivet, and so forth, besides the means described as above, and these means may be used in combination as necessary.

Figure 5:
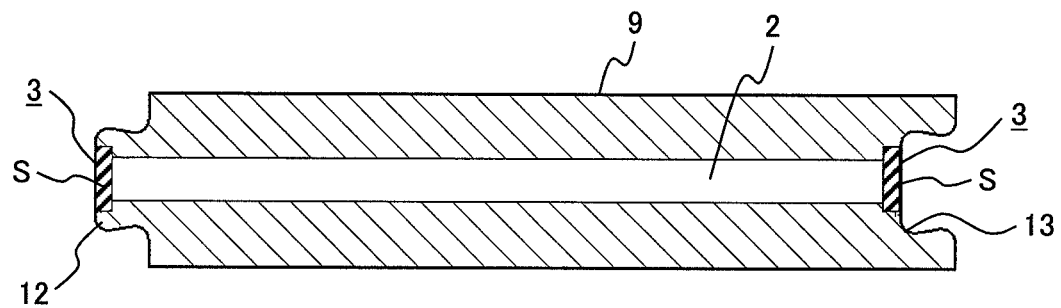
FIG. 5 is a sectional view showing an electrical joining structure of the functional panel according to the second embodiment of the invention.

Now, an electrical joining structure according to the second embodiment of the invention is described in detail hereinafter with reference to FIG. 5. With reference to the recess 13 as well as the protrusion 12 of the panel member 9, one end of the power supply line 2 is exposed to the protrusion 12 of the panel member 9 while the other end of the power supply line 2 is exposed to the surface of the recess 13 of the panel member 9. When the one panel members 9 is fitted to the other panel member 9' to be assembled, the one end 3 of the power supply line 2, at the protrusion 12, comes into face-contact with the other end 3 of the power supply line 2, in the recess 13. With the second embodiment, prior to assembling, a low-melting lead-free solder layer S of Sn-57Bi having a melting point at 139° C. is provided on a surface where the end 3 of the power supply line 2 has been exposed, and after the panel members are fitted with each other to be assembled, a heat beam is applied to the periphery of a joint to cause melting of the solder layers S, thereby effecting electrical joining.

With the second embodiment of the invention, as a means for effecting electrical joining of the electrical conductors, use is made of the low-melting solder of Sn-57Bi having the melting point at 139° C., however, besides the above, use is made of a low-melting lead-free solder including Sn-56Bi-1Ag having a melting point at 139° C., Sn-52In having a melting point at 117° C., and so forth. Use of a low-melting lead-free solder having a melting point substantially in a range of about 110 to about 150° C. will render it possible to inhibit the thermal effect of heating at the time of joining by use of solder, on a panel member structure, and deforming stress at the time when solder has cooled to be solidified

Third Embodiment

Figure 6:
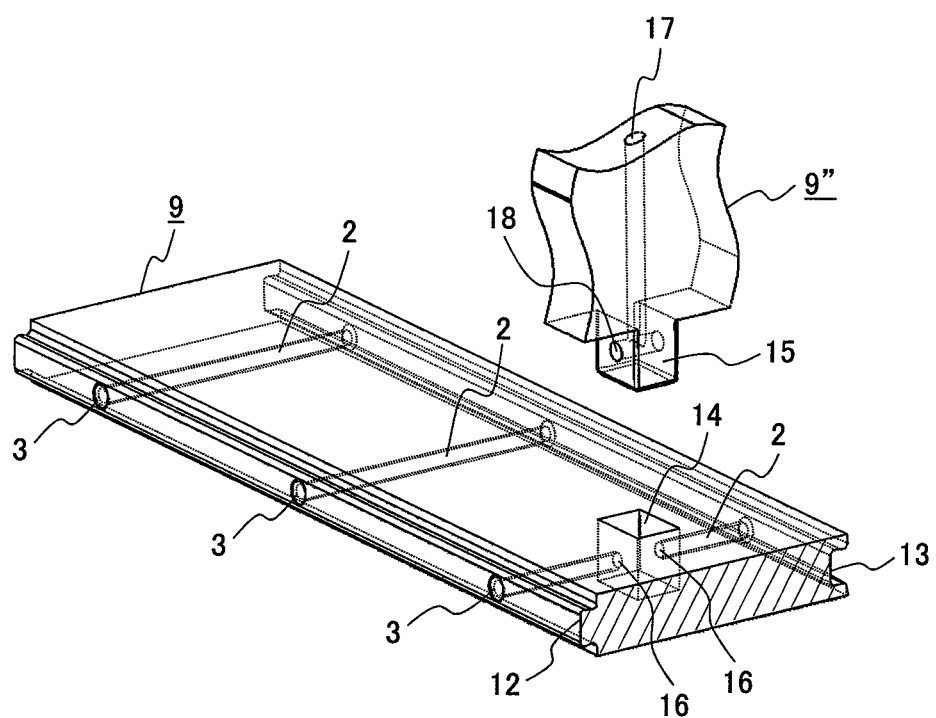
FIG. 6 is a perspective view showing a mechanical linkage structure of a functional panel according to a third embodiment of the invention.

FIG. 6 shows a third embodiment of the invention. There is provided a through hole 14 in the surface of a panel member 9, the through hole 14 being vertically extended so as to reach a power supply line 2. A connector 15 provided in the other panel member 9" is fitted into the through hole 14 to thereby cause respective ends 16 of the power supply line 2, exposed to the inner surface of the through hole 14, to come into contact with an end 18 of a power supply line 17 embedded in the other panel member 9" by the means described in the foregoing. Subsequently, a low-melting solder provided on both the respective ends 16, and the end 18 beforehand is melted by applying the heat beam thereto to accomplish electrical connection therebetween. With the adoption of a configuration according to the third embodiment, the power supply line 2 provided in the panel member 9 can be connected with electrically-driven components, besides the battery 4, and the drive motors 5, without constraints due to a direction along which the panel member 9 is oriented.

With the third embodiment of the invention, as a means for joining the panel member 9 with the other panel member 9", there is shown a configuration for realizing integration through mechanical fitting by way of example, however, there are available various means including a configuration for achieving integration by joining with the use of a mechanical linkage means such as a bolt, screw, rivet, and so forth, besides the means described as above, and these means may be used in combination as necessary.

With the adoption of the configurations suitable for a knockdown panel member, shown in the second and third embodiments, respectively, if the main body of the panel member 9 is damaged due to gravel flying from a road, a vehicle colliding with an obstacle, occurring during running, or due to a traffic accident, and so forth, or a break occurring to the power supply line 2 of the panel member 9, it is possible to remove the solder of only the relevant panel member 9 by reheating, and so forth, to thereby partially disassemble a panel before replacing the relevant panel member 9 with a new panel member, so that the configurations have further advantages in that a work cost, repair cost, and maintenance cost, incurred by a user, can be minimized.

Having described those embodiments of the invention, as described as above, it is to be understood that the invention be not limited to any of those embodiments, and that various changes and modifications may be made in the invention without departing from the spirit and scope thereof.

With the present embodiment of the invention, there have been shown a case where the carbon fiber reinforced resins as laminated are used as the constituent material of the panel member 9 with the power supply lines 2 embedded therein, by way of example, however, the material quality of the invention is not limited thereto, and the invention is widely applicable to a short-fiber reinforcing composite material, and a knitted fabric structured composite material, as well.

Further, an electric signal line for use as the electrical conductor can be embedded in the panel member 9, the electric signal line including an optical fiber of a thermocouple sensor for advising a user of variation in the temperature of the panel member 9, an optical fiber of a strain sensor for advising the user of a distortion amount of the panel member 9, an optical fiber for advising the user of a crack or damage, occurring to the panel member 9, and so forth.

Further, as for placement of the power supply lines 2, inside the panel member, respective placement positions of the power supply lines 2 may be offset in the direction of the board thickness of the panel member 9, or at least two lengths of the power supply lines 2 may be lined up in the direction of the board thickness if the reinforcing fiber 11 is provided so as to be extended toward the center of the board thickness in accordance with the means previously described. Furthermore, even if a projection or a depression occur to either the top surface, or the back surface of the panel member 9 due to the power supply lines 2 being offset against each other, this will have no adverse effect.

EXPLANATION OF REFERENCE 1 electric vehicle
2, 17 power supply lines
3 terminal
16, 18 end
9, 9', 9" panel member
10 carbon fiber sheet
11 carbon fiber
12 protrusion
13 recess
14 through hole
15 connector
S solder layer

The invention claimed is:

1. A functional panel comprising:
a main body of a panel member;
an electrical conductor coated with a semi-cured resin having heat resistance and insulation properties; and
a reinforcing fiber having a continuous filament, for fixing the electrical conductor to the main body of the panel member to thereby provide enhancement,
wherein the functional panel is formed by exposing one end, and the other end of the electrical conductor from the respective end faces of the panel member formed by integral molding,
wherein the respective ends of the electrical conductor of the functional panel are provided with a solder layer, and
wherein the functional panel is configured to be joined to a second functional panel, the second functional panel having an electrical conductor, so that respective ends of the both the electrical conductors are electrically connected with each other.

2. The functional panel according to claim 1, further comprising: fiber sheets impregnated with a thermosetting resin, respectively, to be laminated; the electrical conductors embedded in the fiber sheets, as laminated, by molding; and the reinforcing fiber disposed between the fiber sheets in such a way as to reinforce mutual bonding of the fiber sheet with the electrical conductor.

3. The functional panel according to claim 1, further comprising: fiber sheets disposed in a plurality of directions, respectively along the surface of the panel; the electrical conductors embedded in the fiber sheets, by molding; and the reinforcing fiber disposed between the fiber sheets in such a way as to reinforce mutual bonding of the fiber sheet with the electrical conductor,
wherein the functional panel is integrally molded by injecting resin therein.

4. The functional panel according to claim 1, wherein the end faces of the panel member, exposing the one end, and the other end of the electrical conductor, respectively, have a recess, and a protrusion, respectively, the recess, and the protrusion being capable of being joined with each other in a joint-like manner, and being disassembled.

5. The functional panel according to claim 1, wherein the second functional panel is joined with the functional panel through an intermediary of the respective end faces thereof, and wherein the ends of the electrical conductor in the respective functional panels are electrically connected with each other, thereby making up a new functional panel.

6. The functional panel according to claim 1, wherein a third functional panel having an electrical conductor to be joined with the top surface of the functional panel is provided.

7. An electric vehicle wherein the functional panel according to any one of claims 1 to 6 is used as a structure unit thereof.

8. A method for joining a functional panel, comprising the steps of:

preparing a panel member molded by integral molding, the panel member comprising a main body of the panel member, an electrical conductor coated with a semi-cured resin having heat resistance and insulation properties, and a reinforcing fiber having a continuous filament, for fixing the electrical conductor to the main body of the panel member to thereby provide enhancement;

forming a plurality of functional panels by exposing one end and the other end of the electrical conductor from respective end faces of each of the panel members;

joining the plurality of functional panels with each other, wherein the end face of one of the plurality of functional panels, exposing the end of the electrical conductor embedded in the one of the plurality of functional panels is brought into face-contact with the end face of the other functional panel, exposing the other end of the electrical conductor embedded in the other functional panel, thereby causing the electrical conductors to be electrically connected with each other before joining, and disassembling, wherein the ends of the electrical conductor, exposed to the respective end faces of the functional panel, have a solder layer, respectively, and melting the solder layer after joining of the functional panel, thereby effecting electrical connection between the respective ends of the electrical conductor.

9. The method for joining a functional panel, according to claim 8, further comprising the step of joining, and disassembling the functional panel that comprises fiber sheets impregnated with a thermosetting resin, respectively, to be laminated, the electrical conductors embedded in the fiber sheets, as laminated, by molding, and the reinforcing fiber disposed between the fiber sheets in such a way as to reinforce mutual bonding of the fiber sheet with the electrical conductor.

10. The method for joining a functional panel, according to claim 8, further comprising the step of joining, and disassembling the functional panel that comprises fiber sheets disposed in a plurality of directions, respectively, along the surface of the panel, the electrical conductors embedded in the fiber sheets, by molding, and the reinforcing fiber disposed between the fiber sheets in such a way as to reinforce mutual bonding of the fiber sheet with the electrical conductor, the functional panel being integrally molded by injecting resin therein.

11. The method for joining a functional panel, according to claim 8, wherein a pair of end faces of the panel member, exposing the one end, and the other end of the electrical conductor, respectively, in such a way as to be joined together, have a recess, and a protrusion, respectively, the recess, and the protrusion being capable of being joined with each other in a joint-like manner, and being disassembled.

\* \* \* \* \*